US006411538B1

United States Patent
Kengeri

(12)
(10) Patent No.: US 6,411,538 B1
(45) Date of Patent: Jun. 25, 2002

(54) COMPACT LOAD-LESS STATIC TERNARY CAM

(75) Inventor: Subramani Kengeri, San Jose, CA (US)

(73) Assignee: Silicon Access Networks, San Jose, CA (US)

( * ) Notice: Subject to any disclaimer, the term of this patent is extended or adjusted under 35 U.S.C. 154(b) by 0 days.

(21) Appl. No.: 09/727,527

(22) Filed: Nov. 28, 2000

(51) Int. Cl.[7] ............................................. G11C 15/00
(52) U.S. Cl. ...................... 365/49; 365/189.07; 365/168
(58) Field of Search ....................... 365/49, 168, 189.07

(56) References Cited

U.S. PATENT DOCUMENTS 6,262,907 B1 * 7/2001 Lien et al. ..................... 365/49
6,288,922 B1 * 9/2001 Wong et al. ................... 365/49

* cited by examiner

*Primary Examiner*—Vu A. Le
(74) *Attorney, Agent, or Firm*—Fernandez & Associates LLP

(57) ABSTRACT

A load-less 12-T TCAM wherein a TCAM cell uses two 1-bit 4-T SRAM storage cells that are scalable with technology. The TCAM has a TCAM cell that comprises two 1-bit 4-T SRAM data storage cells and a comparator. Within the TCAM cell, each of the two 1-bit 4-T SRAM storage cells is coupled to a BL by a pass-gate PMOS transistor that has a NP drain diode section. This NP drain diode section has a reverse-biased leakage current that is adapted to keep a dynamic node of the SRAM storage cell high without relying on any resistive-load element. The comparator is coupled to these two 1-bit 4-T SRAM storage cells. The comparator is adapted for matching a reference data with data communicated to the comparator from the two SRAM storage cells. The comparator is a 4-T comparator coupled to these two 4-T SRAM storage cells, thereby making the TCAM a 12-T load-less static TCAM.

20 Claims, 4 Drawing Sheets

COMPACT LOAD-LESS STATIC TERNARY CAM

FIELD OF THE INVENTION

The invention relates to a ternary content addressable memory (TCAM), particularly to a TCAM that uses static random access memory (SRAM) cells.

BACKGROUND OF INVENTION

Many existing variants of TCAM use different combinations of SRAM storage cells and comparator structures. The storage node is usually one of the following: 4-T (with poly-load) SRAM cell, 6-T SRAM cell, or a dynamic random access memory (DRAM) cell. The comparator is usually a NAND or a pass-gate based XOR implementation.

Using a DRAM cell is not as fast as using a SRAM cell. Using a 6-T SRAM based storage cell makes the cell bigger than 4-T SRAM cell. Using a poly-load based 4-T SRAM cell is not easily scalable with technology.

SUMMARY OF INVENTION

The invention provides a TCAM wherein an individual TCAM cell uses two 1-bit 4-T SRAM storage cells. In so doing, the invention provides a TCAM that is more compact than a TCAM implementing 6-T SRAM cells. Also, by avoiding 4-T SRAM cells that incorporate load-resistive elements, the invention provides a TCAM that is scalable with technology.

Preferably, a TCAM cell of a TCAM system comprises two 1-bit 4-T SRAM data storage cells and a comparator. Taken together, these two 1-bit data storage cells provide any of three logic states (a logic 0, a logic 1 and a logic "Don't Care") of the TCAM cell. The first 1-bit 4-T SRAM storage cell is coupled to a BL by a pass-gate PMOS transistor that has a NP drain diode section. A reverse-biased leakage current of this NP drain diode section is adapted to keep a dynamic node of the first SRAM storage cell high without relying on any resistive-load element. The second 1-bit 4-T SRAM cell is coupled to a another BL by a pass-gate PMOS transistor that has a NP drain diode section. A reverse-biased leakage current of this NP drain diode section is adapted to keep a dynamic node of the second SRAM storage cell high without relying on any resistive-load element. The comparator is coupled to these two 4-T SRAM storage cells. The comparator is adapted for matching a reference data with data communicated to the comparator from the two SRAM storage cells. Specifically, the comparator is a 4-T comparator coupled to these two 4-T SRAM storage cells, thereby making the TCAM a 12-T load-less static TCAM.

These and other objects and advantages of the present invention will no doubt become obvious to those of ordinary skill in the art after having read the following detailed description of the preferred embodiments which are illustrated in the various drawing figures.

BRIEF DESCRIPTION OF DRAWINGS

The accompanying drawings which are incorporated in and form a part of this specification, illustrate embodiments of the invention and together with the description, serve to explain the principles of the invention.

DETAILED DESCRIPTION OF PREFERRED EMBODIMENT

Reference is made in detail to the preferred embodiments of the invention. While the invention is described in conjunction with the preferred embodiments, the invention is not intended to be limited by these preferred embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
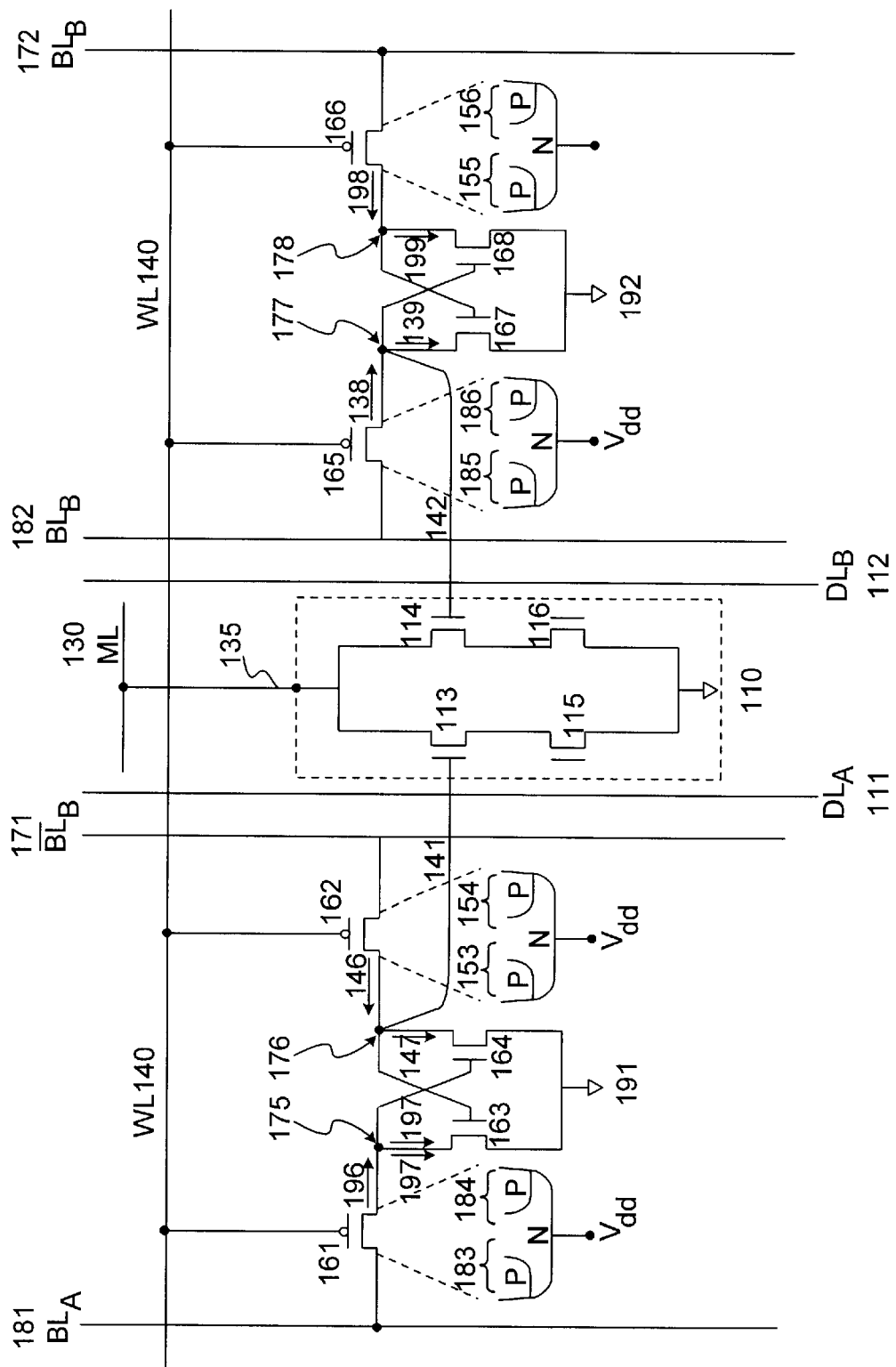
FIG. 1 shows a 12-T load-less static TCAM cell in accordance with one embodiment of the invention.

To highlight advantages of the invention over the prior art approaches, the details of a TCAM designed in accordance with one embodiment of the invention will be compared to several prior art TCAMs. Specifically, a TCAM cell in one embodiment of the invention as shown in FIG. 1 will be compared to a succession of prior art TCAM cells shown in FIGS. 2A–B. Furthermore, in FIG. 3, a dual-port TCAM is shown in accordance with one embodiment of the invention, thus demonstrating that such TCAM cell (according to one embodiment of the invention) is well-suited for implementing a multi-port TCAM system.

Referring now to FIG. 1, a TCAM cell 100 of a TCAM system is shown in accordance with one embodiment of the invention. TCAM cell 100 comprises a comparator 110 and two 1-bit SRAM storage cells 191–192. Cell 191 provides binary states of a logic 1 and a logic 0; similarly, cell 192 provides binary states of a logic 1 and a logic 0. With 1-bit cells 191–192 taken together, TCAM cell 100 provides ternary states of a logic 1, a logic 0, and a logic "Don't Care."

Referring still to FIG. 1, a match line (ML) 130 is coupled to comparator 110 by wire 135. Four pass-gates 113–114 of NMOS type are implemented for comparator 110. Pass-gate 115 of comparator 110 is coupled to a data line (DL) 111; pass-gate 116 is coupled to another DL 112. Pass-gate 113 is coupled to cell 191 via a wire 141; pass-gate 114 is coupled to cell 192 via a wire 142.

A logic state stored by cell 191 is communicated to comparator 110 through wire 141; a logic state stored by cell 192 is communicated to comparator 110 through wire 142. Taken together, these two logic states as communicated to comparator 110 represent one of ternary states (a logic 1, a logic 0 and a logic 'Don't Care.') of TCAM cell 100. On the other hand, incoming reference data (to be matched to logic state of TCAM 100) are communicated to comparator 110 through DLs 111–112. Specifically, comparator 110 communicates to ML 140 when a match or a mismatch has occurred between logic state delivered to comparator 110 from cells 191–192 (respectively through wires 141–142) and logic state of the reference data delivered to comparator 110 (through DLs 111–112).

Continuing with FIG. 1, four transistors 161–164 are implemented in cell 191; four transistors 165–168 are implemented in cell 192. According to the present embodiment of the invention, when the four transistors of comparator 110 are also included, the total transistor count of TCAM cell 100 is 12, thereby making TCAM cell 100 a "12-T TCAM."

Within cell 191, transistors 161–162 are PMOS pass-gates activated through word line (WL) 135. These two pass-gates 161–162 control read/write data access to cell 191 through complementary bit lines (BLs) 181 and 171. Specifically, pass-gate 161 is coupled to dynamic node 175 that in turn controls the state of NMOS transistor 164, while pass-gate 162 is coupled to dynamic node 176 that in turn controls the state of NMOS transistor 163. As such, cell 191 is adapted to function as a 2-inverter latch.

More specifically in cell 191, PMOS pass-gate 161 is constructed with a N-well having P-source and P-drain separated by a P-channel. The N-well is kept at supply voltage Vdd. PMOS pass-gate 161 can be considered as containing two diodes, a source diode 183 and a drain diode 184. Drain diode 184, the diode closer to dynamic node 175, exhibits reverse current leakage that provides a current I(p) 196. When the state of dynamic node 175 is high, current I(p) 196 is being utilized in the present embodiment for keeping dynamic node 175 high. Because I(p) 196 is considerably greater than a current I(n) 197 as shown in FIG. 1, resistor(s) that are usually implemented for providing I(p) 196 are no longer needed in the construction of cell 191. Thus, resistor(s) are eliminated from the construction of cell 191.

Additionally, PMOS pass-gate 162 is constructed with a N-well having P-source and P-drain separated by a P-channel. The N-well is kept at supply voltage Vdd. PMOS pass-gate 162 can be considered as containing two diodes, a source diode 154 and a drain diode 153. Drain diode 153, the diode closer to dynamic node 176, exhibits reverse current leakage that provides a current I(p) 146. When the state of dynamic node 176 is high, current I(p) 146 is being utilized in the present embodiment for keeping dynamic node 176 high. Because I(p) 146 is considerably greater than a current I(n) 147 as shown in FIG. 1, resistor(s) that are usually implemented for providing I(p) 146 are no longer needed in the construction of cell 191. Thus, resistor(s) are eliminated from the construction of cell 191.

Advantageously, not only is the number of transistors kept at four for SRAM cell 191, but the use of area consuming resistors are eliminated.

Similarly, within cell 192, transistors 163–164 are PMOS pass-gates activated through word line (WL) 135. These two pass-gates 163–164 control read/write data access to cell 192 through complementary bit lines (BLs) 182 and 172. Specifically, pass-gate 165 is coupled to dynamic node 177 that in turn controls the state of NMOS transistor 168, while pass-gate 166 is coupled to dynamic node 178 that in turn controls the state of NMOS transistor 167. As such, cell 192 is adapted to function as a 2-inverter latch.

More specifically in cell 192, PMOS pass-gate 166 is constructed with a N-well having P-source and P-drain separated by a P-channel. The N-well is kept at supply voltage Vdd. PMOS pass-gate 166 can be considered as containing two diodes, a source diode 156 and a drain diode 155. Drain diode 155, the diode closer to dynamic node 178, exhibits reverse current leakage that provides a current I(p) 198. When dynamic node 178 is high, current I(p) 198 is being utilized in the present embodiment for keeping dynamic node 178 high. Because I(p) 198 is considerably greater than a current I(n) 199 as shown in FIG. 1, resistor(s) that are usually implemented for providing I(p) 198 are no longer needed in the construction of cell 192. Thus, resistor (s) are eliminated from the construction of cell 192.

PMOS pass-gate 165 is constructed with a N-well having P-source and P-drain separated by a P-channel. The N-well is kept at supply voltage Vdd. PMOS pass-gate 161 can be considered as containing two diodes, a source diode 185 and a drain diode 186. Drain diode 186, the diode closer to dynamic node 177, exhibits reverse current leakage that provides a current I(p) 138. When dynamic node 177 is high, current I(p) 138 is being utilized in the present embodiment for keeping dynamic node 177 high. Because I(p) 138 is considerably greater than a current I(n) 139 as shown in FIG. 1, resistor(s) that are usually implemented for providing I(p) 138 are no longer needed in the construction of cell 192. Thus, resistor(s) are eliminated from the construction of cell 192.

Advantageously, not only is the number of transistors kept at four for SRAM cell 192, but the use of area consuming resistor is eliminated.

In summary, in TCAM cell 100, a PMOS transistor comprises a source diode and a drain diode, wherein the drain diode is coupled to a dynamic node. The reverse current leakage of the drain diode, rather than being avoided, is being utilized to perform a certain function typically performed with resistors. Specifically, when the dynamic node coupled to the drain diode needs to be high, this reverse voltage leakage is utilized to supply a current I(p) to keep the dynamic node high. That is, supplying current I(p) to a dynamic node, typically supplied by a resistor, is being supplied by the reverse current leakage of the drain diode.

Figure 2A:
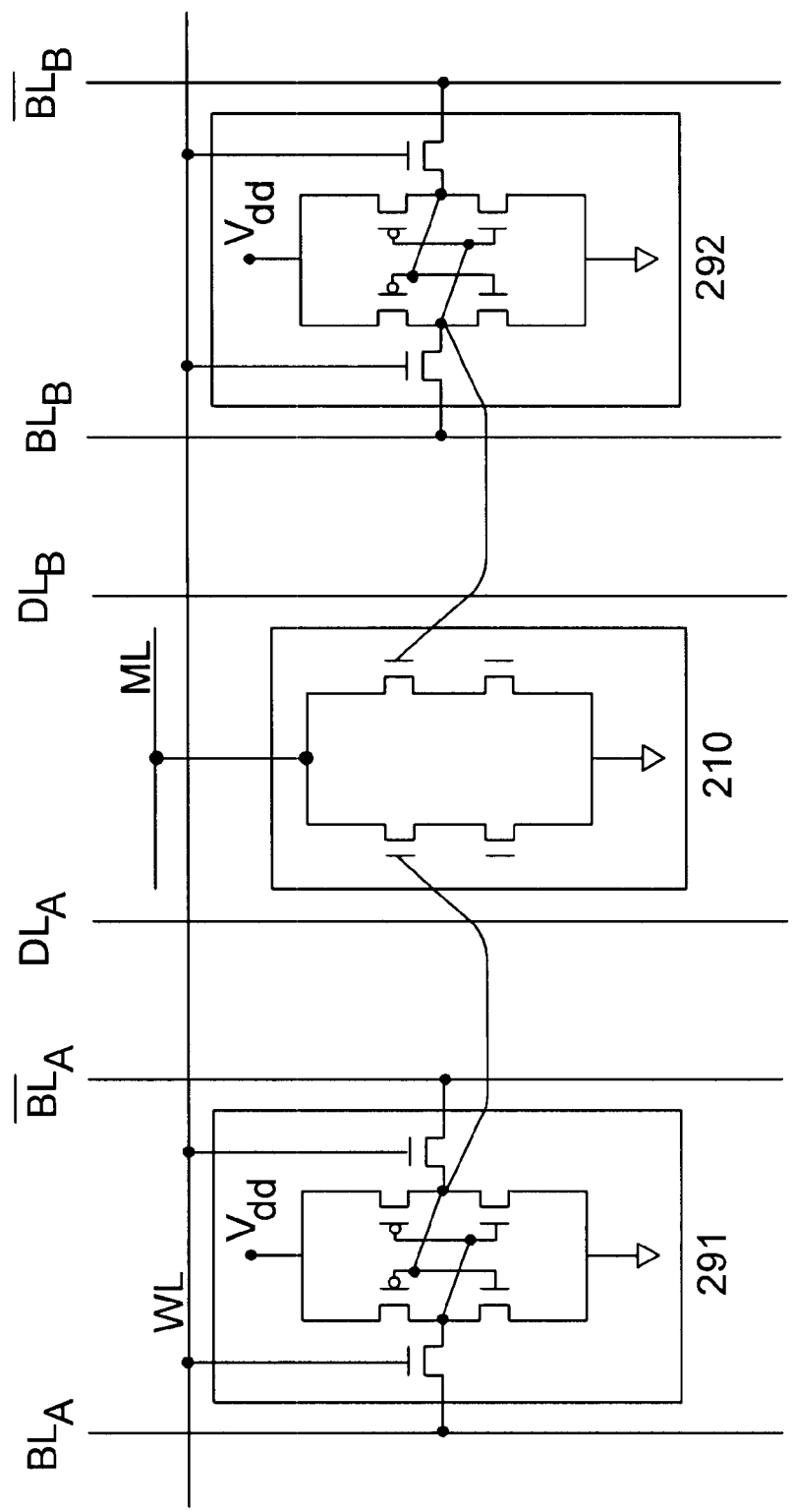
FIG. 2A shows a prior art 16-T static TCAM cell.
Figure 2B:
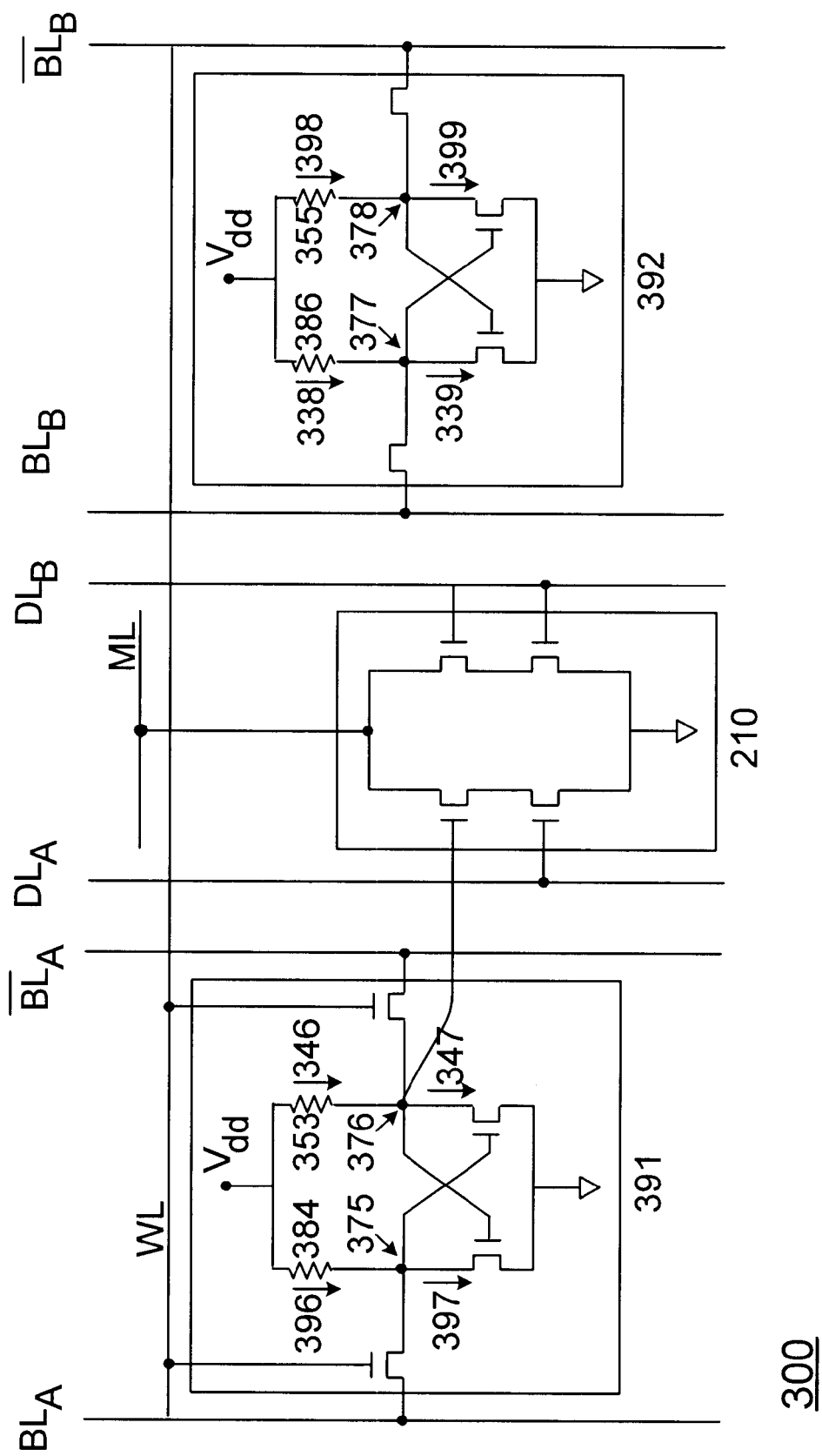
FIG. 2B shows another prior art 12-T load-resistive static TCAM cell.

FIGS. 2A–B will now be discussed in view of FIG. 1. Specifically, each of FIGS. 2A–B shows a prior art TCAM cell. Each of these prior art TCAM cell is described in view of TCAM cell of FIG. 1 in order to highlight advantages of the present invention over each prior art TCAM cell.

Referring now to FIG. 2A, a TCAM cell 200 is shown in accordance with one prior art approach. TCAM 200 comprises a two 1-bit data storage cells 291–292 coupled to a comparator 210. Each of cells 291–292 is constructed with 6 transistors. Comparator 210 is constructed with 4 transistors. As such, the total transistor count of TCAM cell 200 is 16, thereby making TCAM cell 200 into a "16-T TCAM cell." More specifically, because cells 291–292 are SRAM cells, TCAM cell 200 can be characterized as a static 16-TCAM cell.

Continuing with FIG. 2A in view of FIG. 1, prior art TCAM cell 200 has an obvious disadvantage when TCAM cell 200 is compared to TCAM cell 100 shown in FIG. 1. That is, prior TCAM cell 200 consumes more area because it requires four more transistors than TCAM 100. As such, a TCAM system using the design of prior TCAM cell 200 cannot achieve the same density as a TCAM system using the design of TCAM cell 100.

Referring now to FIG. 2B in view of FIG. 1, another prior art TCAM cell 300 is shown. TCAM cell 300 comprises two 1-bit data storage cells 391–392 coupled to a comparator 310. Each of cells 391–392 is constructed with 4 transistors. Comparator 210 is constructed with 4 transistors. As such, the total transistor count of TCAM cell 300 is 12, thereby making TCAM cell 201 into a "12-T TCAM cell." However, in contrast to TCAM 100 of FIG. 1, TCAM 200 requires resistive-load in the form of two resistors.

Within cell 391 specifically, resistor 384 is implemented to supply a current I(p) 396 for keeping dynamic node 375 high. Similarly, resistor 353 is implemented to supply a current I(p) 346 for keeping dynamic node 376 high. On the other hand, within cell 391 specifically, resistor 355 is implemented to supply a current I(p) 398 for keeping dynamic node 378 high. Similarly, resistor 386 is implemented to supply a current I(p) 338 for keeping dynamic node 377 high. As such, because cells 391–392 are SRAM cells having resistors, TCAM cell 300 can be characterized as a loaded static 12-T TCAM cell.

Continuing with FIG. 2B in view of FIG. 1, prior art TCAM cell 300 has an obvious disadvantage when TCAM cell 300 is compared to TCAM cell 100 shown in FIG. 1. That is, prior TCAM cell 300 consumes more area because it requires resistors that in turn consume area, whereas TCAM 100 does not require resistor (for the reason given above). As such, a TCAM system using the design of prior TCAM cell 300 cannot achieve the same density as a TCAM system using the design of TCAM cell 100.

Figure 3:
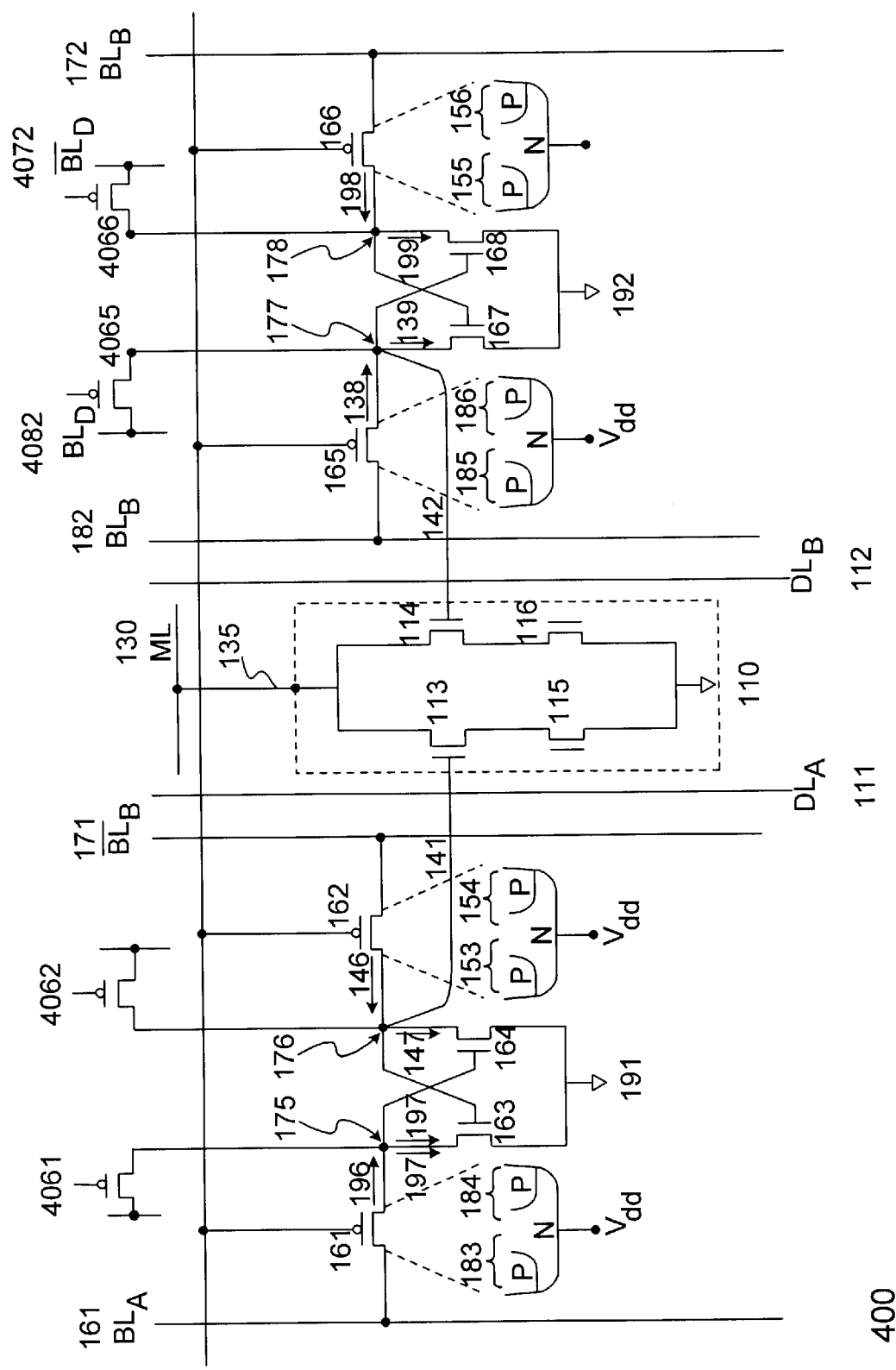
FIG. 3 shows a dual-port TCAM system using 12-T load-less static TCAM cells in accordance with one embodiment of the invention.

Referring now to FIG. 3, a dual-port TCAM system using TCAM cells (shown in FIG. 1) is shown in accordance with one embodiment of the invention. As shown, two additional pass-gate PMOS transistors 4061–4062 are coupled respectively to dynamic nodes 175–176. Specifically, transistor 4061 couples BL 4081 to dynamic node 175; transistor 4062 couples BL 4071 to dynamic node 176. On the other hand, two additional pass-gate PMOS transistors 4065–4066 are coupled respectively to dynamic nodes 177–178. Specifically, transistor 4065 couples BL 4082 to dynamic node 177; transistor 4066 couples BL 4072 to dynamic node 178.

As understood herein, the invention need not be limited to a dual-port TCAM system. For example, in another embodiment, the invention is implemented as a multi-port TCAM system wherein the number of ports exceeds two.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A ternary content addressable memory (TCAM) cell, said TCAM cell comprising:
   a first 1-bit 4-T static random access memory (SRAM) cell coupled to a first bit line (BL) by a first pass-gate PMOS transistor that has a first NP drain diode section whose reverse-biased leakage current is adapted to keep a first dynamic node of said first cell high without relying on any resistive-load element; and
   a second 1-bit 4-T SRAM cell coupled to a second BL by a second pass-gate PMOS transistor that has a second NP drain diode section whose reverse-biased leakage current is adapted to keep a second dynamic node of said second cell high without relying on any resistive-load element.

2. The TCAM cell of claim 1, further comprising:
   a 4-T comparator coupled to said first and said second cells, said comparator adapted for matching reference data with data communicated to said comparator from said first and said second cells, wherein said comparator is coupled to a match line (ML) adapted to indicate a mismatch between said reference data and said data communicated by said first and second cells.

3. The TCAM cell of claim 2, wherein said comparator is coupled to a first and a second data lines (DLs) adapted to deliver said reference data to said comparator.

4. The TCAM cell of claim 2, wherein said first cell communicates its logic state to said comparator via a first wire coupling a first output dynamic node of said first cell to a first transistor of said comparator, and wherein said second cell communicates its logic state to said comparator via a second wire coupling a second output dynamic node of said second cell to a second transistor of said comparator.

5. The TCAM cell of claim 2, wherein the gate of said first pass-gate PMOS transistor is coupled to a word line (WL) adapted to switch the state of said first pass-gate PMOS transistor, and wherein the gate of said second pass-gate PMOS transistor is coupled to said WL adapted to switch the state of said second pass-gate PMOS transistor.

6. The TCAM cell of claim 1, wherein both read and write accesses to said first cell are performed using said first BL and a first complementary BL of said first BL, said first complementary BL coupled to said first cell by a third pass-gate PMOS transistor that has a third NP drain diode section whose reverse-biased leakage current is adapted to keep a third dynamic node of said first cell high without relying on any resistive-load element; and
   wherein both read and write accesses of said second cell are performed using said second BL and a second complementary BL of said second BL, said second complementary BL coupled to said second cell by a fourth pass-gate PMOS transistor that has a fourth NP drain diode section whose reverse-biased leakage current is adapted to keep a fourth dynamic node of said second cell high without relying on any resistive-load element.

7. A TCAM, said TCAM comprising:
   a first 1-bit 4-T SRAM cell coupled to a first BL by a first pass-gate PMOS transistor that has a first NP drain diode section whose reverse-biased leakage current is adapted to keep a first dynamic node of said first cell high without relying on any resistive-load element; and
   a second 1-bit 4-T SRAM cell coupled to a second BL by a second pass-gate PMOS transistor that has a second NP drain diode section whose reverse-biased leakage current is adapted to keep a second dynamic node of said second cell high without relying on any resistive-load element; and
   a 4-T comparator coupled to said first and said second cells, said comparator adapted for matching reference data with data communicated to said comparator from said first and said second cells.

8. The TCAM of claim 7, further comprising:
   a ML coupled to said comparator, said ML adapted for indicating a mismatch between said reference data and said data communicated by said first and second cells.

9. The TCAM of claim 7, further comprising a first and a second DLs coupled to said comparator, said first and second DLs adapted to deliver said reference data to said comparator.

10. The TCAM of claim 7, further comprising:
    a first wire coupling a first output dynamic node of said first cell to a first transistor of said comparator, said first wire adapted to communicates the logic state of said first cell to said comparator; and
    a second wire coupling a second output dynamic node of said second cell to a second transistor of said comparator, said second wire adapted to communicates the logic state of said second cell to said comparator.

11. The TCAM of claim 7, further comprising:
    a WL coupled to the gate of said first pass-gate PMOS transistor and the gate of said second pass-gate PMOS transistor, said WL adapted to switch the state of said first pass-gate PMOS transistor, said WL also adapted to switch the state of said second pass-gate PMOS transistor.

12. The TCAM of claim 7, further comprising:
a first complementary BL of said first BL, wherein both read and write accesses of said first cell are performed using said first BL and said first complementary BL, said first cell coupled to a said first complementary BL by a third pass-gate PMOS transistor that has a third NP drain diode section whose reverse-biased leakage current is adapted to keep a third dynamic node of said first cell high without relying on any resistive-load element; and
a second complementary BL of said second BL, wherein both read and write accesses of said second cell are performed using said second BL and said second complementary BL, said cell coupled to said second complementary BL by a fourth pass-gate PMOS transistor that has a fourth NP drain diode section whose reverse-biased leakage current is adapted to keep a fourth dynamic node of said second cell high without relying on any resistive-load element.

13. A TCAM, said TCAM comprising:
a first 1-bit 4-T SRAM cell coupled to a first BL by a first pass-gate PMOS transistor that has a first NP drain diode section whose reverse-biased leakage current is adapted to keep a first dynamic node of said first cell high without relying on any resistive-load element;
a second 1-bit 4-T SRAM cell coupled to a second BL by a second pass-gate PMOS transistor that has a second NP drain diode section whose reverse-biased leakage current is adapted to keep a second dynamic node of said second cell high without relying on any resistive-load element, wherein the logic state of said first and the logic state of second cells constitute the logic state of a first TCAM cell;
a third 1-bit 4-T SRAM cell coupled to a third BL by a third pass-gate PMOS transistor that has a third NP drain diode section whose reverse-biased leakage current is adapted to keep a third dynamic node of said third cell high without relying on any resistive-load element;
a fourth 1-bit 4-T SRAM cell coupled to a fourth BL by a fourth pass-gate PMOS transistor that has a fourth NP drain diode section whose reverse-biased leakage current is adapted to keep a fourth dynamic node of said fourth cell high without relying on any resistive-load element, wherein the logic state of said third and the logic state of fourth cells constitute the logic state of a second TCAM cell.

14. The TCAM of claim 13, further comprising:
a 4-T comparator coupled to said first, said second cells, said third cell and said fourth cell, wherein said comparator is adapted for matching a reference data with data communicated to said comparator from said first and said second cells, and wherein said comparator is also adapted for matching said reference data with data communicated to said comparator from said third and said fourth cells.

15. The TCAM of claim 14, further comprising:
a ML coupled to said comparator, said ML adapted for indicating a mismatch between said reference data and said data communicated by said first and second cells, said ML also adapted for indicating a mismatch between said reference data and said data communicated by said third and fourth cells.

16. The TCAM of claim 14, further comprising:
a first and a second DLs coupled to said comparator, said first and second DLs adapted to deliver said reference data to said comparator.

17. The TCAM of claim 14, further comprising:
a first wire coupling a first output dynamic node of said first cell to a first transistor of said comparator, said first wire adapted to communicates the logic state of said first cell to said comparator;
a second wire coupling a second output dynamic node of said second cell to a second transistor of said comparator, said second wire adapted to communicates the logic state of said second cell to said comparator;
a third wire coupling a third output dynamic node of said third cell to said first transistor of said comparator, said third wire adapted to communicates the logic state of said third cell to said comparator; and
a fourth wire coupling a fourth output dynamic node of said fourth cell to said second transistor of said comparator, said fourth wire adapted to communicates the logic state of said fourth cell to said comparator.

18. The TCAM of claim 13, further comprising:
a first WL coupled to the gate of said first pass-gate PMOS transistor and the gate of said second pass-gate PMOS transistor, said first WL adapted to switch the state of said first pass-gate PMOS transistor, said first WL also adapted to switch the state of said second pass-gate PMOS transistor; and
a second WL coupled to the gate of said third pass-gate PMOS transistor and the gate of said fourth pass-gate PMOS transistor, said second WL adapted to switch the state of said third pass-gate PMOS transistor, said second WL also adapted to switch the state of said fourth pass-gate PMOS transistor.

19. The TCAM of claim 13, further comprising:
a first complementary BL of said first BL, wherein both read and write accesses of said first cell are performed using said first BL and said first complementary BL;
a second complementary BL of said second BL, wherein both read and write accesses of said second cell are performed using said second BL and said second complementary BL;
a third complementary BL of said third BL, wherein both read and write accesses of said third cell are performed using said third BL and said complementary BL; and
a fourth complementary BL of said fourth BL, wherein both read and write accesses of said fourth cell are performed using said fourth BL and said fourth complementary BL.

20. The TCAM of claim 19, wherein said first complementary BL is coupled to said first cell by a fifth pass-gate PMOS transistor that has a fifth NP drain diode section whose reverse-biased leakage current is adapted to keep a fifth dynamic node of said first cell high without relying on any resistive-load element
wherein said second complementary BL is coupled to said second cell by a sixth pass-gate PMOS transistor that has a sixth NP drain diode section whose reverse-biased leakage current is adapted to keep a sixth dynamic node of said second cell high without relying on any resistive-load element;
wherein said third complementary BL is coupled to said third cell by a seventh pass-gate PMOS transistor that has a seventh NP drain diode section whose reverse-biased leakage current is adapted to keep a seventh dynamic node of said third cell high without relying on any resistive-load element; and
wherein said fourth complementary BL is coupled to said fourth cell by a eighth pass-gate PMOS transistor that has a eighth NP drain diode section whose reverse-biased leakage current is adapted to keep a eighth dynamic node of said fourth cell high without relying on any resistive-load element.

* * * * *